US009741278B2

(12) United States Patent
Kang et al.

(10) Patent No.: US 9,741,278 B2
(45) Date of Patent: Aug. 22, 2017

(54) ORGANIC LIGHT EMITTING DIODE DISPLAY

(71) Applicant: Samsung Display Co., Ltd., Yongin, Gyeonggi-do (KR)

(72) Inventors: So Young Kang, Gwangju (KR); Jae Yong Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/048,923

(22) Filed: Feb. 19, 2016

(65) Prior Publication Data
US 2016/0321972 A1    Nov. 3, 2016

(30) Foreign Application Priority Data

Apr. 30, 2015  (KR) .......................... 10-2015-0062082

(51) Int. Cl.
*G09G 3/00* (2006.01)
*H01L 27/32* (2006.01)
*G09G 3/3208* (2016.01)
*H01L 51/44* (2006.01)
*G09G 3/3225* (2016.01)
*H01L 51/00* (2006.01)

(52) U.S. Cl.
CPC .......... *G09G 3/006* (2013.01); *G09G 3/3208* (2013.01); *G09G 3/3225* (2013.01); *H01L 27/3276* (2013.01); *H01L 51/0031* (2013.01); *H01L 51/441* (2013.01)

(58) Field of Classification Search
CPC .... G09G 3/006; G09G 3/3208; G09G 3/3225; H01L 51/0031; H01L 51/441; H01L 51/3276
See application file for complete search history.

(56) References Cited

U.S. PATENT DOCUMENTS

| 2003/0085405 A1* | 5/2003 | Park | H01L 27/3276 257/72 |
| 2009/0170230 A1* | 7/2009 | Kidu | H01L 27/3211 438/35 |
| 2009/0267496 A1* | 10/2009 | Jeong | G09G 3/006 313/504 |
| 2010/0052713 A1* | 3/2010 | Kunimori | G09G 3/006 324/754.01 |

(Continued)

FOREIGN PATENT DOCUMENTS

| KR | 10-2002-0009414 A | 2/2002 |
| KR | 10-2002-0027958 A | 4/2002 |

(Continued)

*Primary Examiner* — Allan R Wilson
(74) *Attorney, Agent, or Firm* — Knobbe Martens Olson & Bear LLP

(57) ABSTRACT

An organic light emitting diode (OLED) display is disclosed. In one aspect, the OLED display includes a display unit positioned over a substrate and a lighting test circuit positioned outside the display unit on the substrate. The OLED display also includes a pad unit including a plurality of first pads configured to supply a control signal to the display unit, and a plurality of second pads positioned outside the first pads and configured to transfer a DC signal. The second pads include a power pad configured to supply power to the display unit, and a lighting test pad positioned outside the power pad.

19 Claims, 5 Drawing Sheets

(56) References Cited

U.S. PATENT DOCUMENTS

| | | | | |
|---|---|---|---|---|
| 2011/0043500 A1* | 2/2011 | Kwak | ............... | G09G 3/006 345/206 |
| 2011/0050660 A1* | 3/2011 | Kim | ............... | G09G 3/006 345/205 |
| 2016/0260367 A1* | 9/2016 | Kwak | ............... | G09G 3/006 |

FOREIGN PATENT DOCUMENTS

| KR | 10-2006-0010355 A | 2/2006 |
|---|---|---|
| KR | 10-2006-0058515 A | 5/2006 |
| KR | 10-2007-0001583 A | 1/2007 |
| KR | 10-2007-0028629 A | 3/2007 |
| KR | 10-2009-0048742 A | 5/2009 |
| KR | 10-2012-0096256 A | 8/2012 |
| KR | 10-1283365 B1 | 7/2013 |

\* cited by examiner

ORGANIC LIGHT EMITTING DIODE DISPLAY

RELATED APPLICATIONS

This application claims priority to and the benefit of Korean Patent Application No. 10-2015-0062082 filed in the Korean Intellectual Property Office on Apr. 30, 2015, the entire contents of which are incorporated herein by reference.

BACKGROUND

Field

The described technology generally relates to an organic light emitting diode display.

Description of the Related Technology

An organic light emitting diode (OLED) display includes a display panel including a display unit and a pad unit, and a chip on film (or a flexible printed circuit board) attached to the pad unit to output a control signal to the display unit. The display unit includes a pixel unit having a number of pixels formed therein and a driving circuit unit for supplying a gate signal or a light emission control signal to the pixel unit. It can further include a lighting test circuit for checking whether pixels turn on in a normal way.

The pad unit includes a plurality of first pads receiving a signal through a driving integrated circuit (IC) of the chip on film, and a plurality of second pads positioned outside the first pads and receiving a DC signal without using the driving IC. The second pads may include a power pad for supplying first and second power input to the display unit and a lighting test pad for supplying a lighting control signal to the lighting test circuit.

Each of the first pads is connected to the driving circuit unit through a first wiring. The power pad is connected to the display unit through a power wiring, and the lighting test pad is connected to the lighting test circuit through a lighting test wiring.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One inventive aspect is an OLED display provided with a pad unit including a plurality of pads.

Another aspect is an OLED display that can prevent a burning phenomenon due to a voltage difference between a power wiring and a lighting test wiring during an aging process of a manufacturing process by configuring the power wiring and the lighting test wiring so as not to overlap each other.

Another aspect is s an OLED display including a display unit, a lighting test circuit, and a pad unit. The display unit may be formed on a substrate, and the lighting test circuit may be formed outside the display unit on the substrate. The pad unit may include a plurality of first pads configured to supply a control signal to the display unit, and a plurality of second pads positioned outside the plurality of first pads and configured to transfer a DC signal. The plurality of second pads may include a power pad configured to supply power to the display unit, and a lighting test pad positioned outside the power pad.

The OLED display may further include: a power wiring configured to connect the power pad and the display unit; and a lighting test wiring not overlapping the power wiring and configured to connect the lighting test pad and the lighting test circuit. The power wiring may include a part extending in one direction and connected to the power pad, and the lighting test wiring may include a part extending from the lighting test pad in a direction where the lighting test wiring becomes far from the power wiring.

The lighting test circuit may be formed at one side of the substrate opposite to the pad unit, and connected to data lines of the display unit. The power wiring may be formed to surround the display unit, and the lighting test wiring may be formed outside the power wiring.

The power pad and the power wiring may include a first power pad and a first power wiring configured to supply first power, a second power pad and a second power wiring configured to supply second power, respectively. The first power wiring and the second power wiring may be formed of a source-drain metal layer.

The display unit may include a first pixel, a second pixel, and a third pixel having different light emission colors. The lighting test pad and the lighting test wiring may include three lighting test pads and three lighting test wirings for the first pixel, the second pixel, and the third pixel, respectively. At least one of the three lighting test wirings may be formed of a first gate metal layer, and the others may be formed of a second gate metal layer.

Another aspect is an organic light emitting diode (OLED) display comprising: a display unit formed over a substrate; a lighting test circuit formed outside the display unit on the substrate; and a pad unit including a plurality of first pads configured to supply a control signal to the display unit, and a plurality of second pads positioned outside the first pads and configured to transfer a DC signal, wherein the second pads include a power pad configured to supply power to the display unit, and a lighting test pad positioned outside the power pad.

The above OLED display further comprises: a power wiring electrically connecting the power pad and the display unit; and a lighting test wiring not overlapping the power wiring and electrically connecting the lighting test pad and the lighting test circuit. In the above OLED display, the power wiring includes a first portion extending in one direction and connected to the power pad, and wherein the lighting test wiring includes a second portion extending from the lighting test pad in a direction where the lighting test wiring becomes farther from the power wiring. In the above OLED display, the lighting test circuit is formed at one side of the substrate opposite to the pad unit, and connected to data lines of the display unit. In the above OLED display, the power wiring surrounds the display unit, and wherein the lighting test wiring is formed outside the power wiring.

In the above OLED display, the power pad and the power wiring include a first power pad and a first power wiring configured to supply first power, a second power pad and a second power wiring configured to supply second power, respectively. In the above OLED display, each of the first power wiring and the second power wiring is formed of a source-drain metal layer. In the above OLED display, the display unit includes a first pixel, a second pixel, and a third pixel configured to emit light of different colors, and wherein the lighting test pad and the lighting test wiring include three lighting test pads and three lighting test wirings for the first pixel, the second pixel, and the third pixel, respectively. In the above OLED display, at least one of the three lighting test wirings is formed of a first gate metal layer, and wherein the others are formed of a second gate metal layer.

The above OLED display further comprises: a power wiring configured to connect the power pad and the display unit; and a lighting test wiring configured to connect the lighting test pad and the lighting test circuit, wherein the lighting test wiring is positioned farther from the display unit than the power wiring. In the above OLED display, the power wiring and the lighting test wiring are positioned outside the display unit. In the above OLED display, the power wiring and the lighting test wiring are directly connected to the pad unit. In the above OLED display, the power wiring and the lighting test wiring do not overlap each other on a plain view of the OLED display. In the above OLED display, the power wiring and the lighting test wiring are connected to different ones of the second pads.

Another aspect is an organic light emitting diode (OLED) display comprising: a display unit configured to display an image; a lighting test circuit positioned outside the display unit; a pad unit including a plurality of first pads configured to supply a control signal to the display unit, a power pad positioned outside the first pads and configured to supply power to the display unit, and a lighting test pad positioned outside the power pad; a power wiring electrically connecting the power pad and the display unit; and a lighting test wiring electrically connecting the lighting test pad and the lighting test circuit, wherein the power wiring and the lighting test wiring do not overlap each other on a plain view of the OLED display.

In the above OLED display, the power wiring and the lighting test wiring are positioned outside the display unit. In the above OLED display, the power wiring and the lighting test wiring are directly connected to the pad unit. In the above OLED display, the power wiring and the lighting test wiring are connected to different ones of the second pads. In the above OLED display, the power wiring includes a first portion extending in one direction and connected to the power pad, and wherein the lighting test wiring includes a second portion extending from the lighting test pad in a direction where the lighting test wiring becomes farther from the power wiring. In the above OLED display, the lighting test circuit is positioned at one side of the substrate opposite to the pad unit, and connected to data lines of the display unit.

According to an exemplary embodiment, the lighting test wiring does not overlap the power wiring, so that heat is not generated even though a large voltage difference occurs between the power wiring and the lighting test wiring during the aging process. Therefore, it is possible to prevent damage to the display panel due to burning.

DETAILED DESCRIPTION OF CERTAIN INVENTIVE EMBODIMENTS

Figure 1:
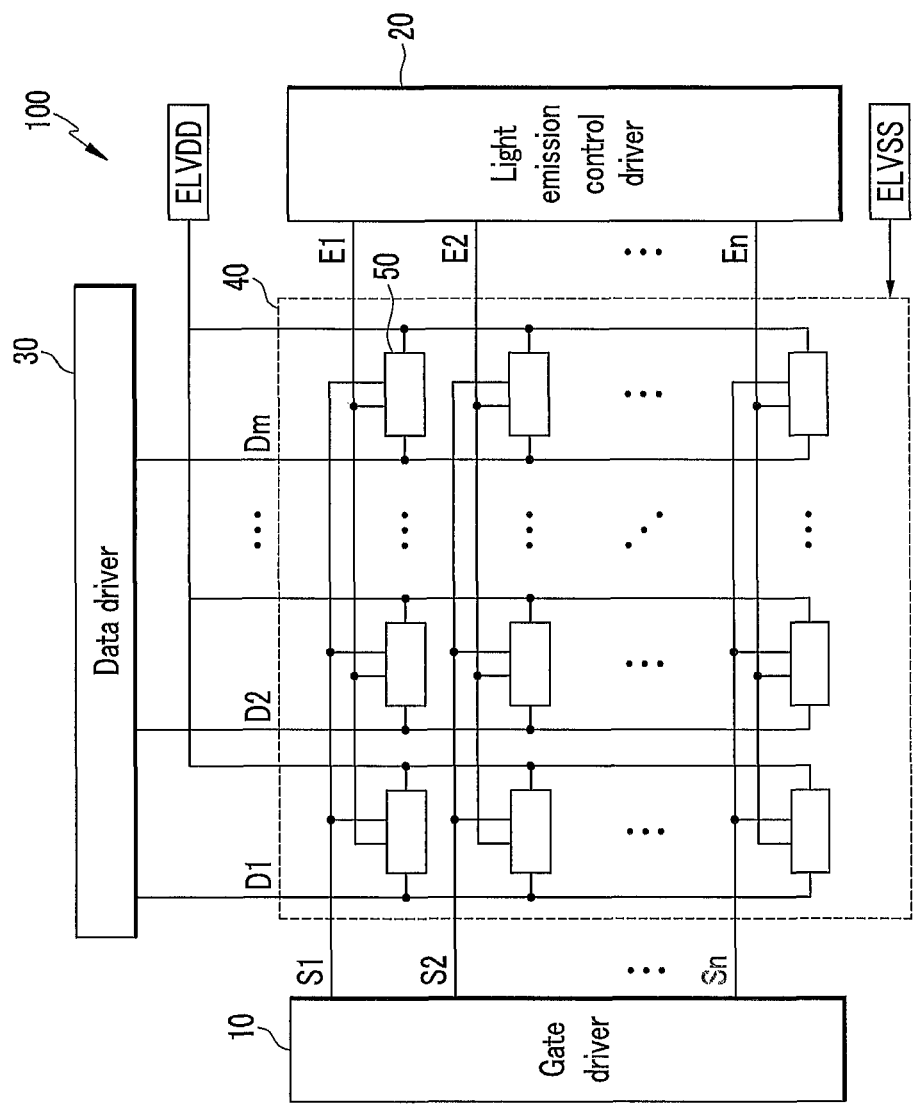
FIG. 1 is a block diagram illustrating an exemplary embodiment of an OLED display.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

In the specification, it will be understood that when an element such as a layer, film, region, or substrate is referred to as being "on" another element, it can be directly on the other element or intervening elements may also be present. Further, the word "on" means positioning on or below the object portion, but does not essentially mean positioning on the upper side of the object portion based on a gravity direction.

In the specification, unless explicitly described to the contrary, the word "comprise" and variations such as "comprises" or "comprising", will be understood to imply the inclusion of stated elements but not the exclusion of any other elements. In addition, the size and thickness of each configuration shown in the drawings are arbitrarily shown for understanding and ease of description, but the present disclosure is not limited thereto. In this disclosure, the term "substantially" includes the meanings of completely, almost completely or to any significant degree under some applications and in accordance with those skilled in the art. Moreover, "formed or positioned on" can also mean "formed or positioned over." The term "connected" includes an electrical connection.

FIG. 1 is a block diagram illustrating an exemplary embodiment of an OLED display 100. Depending on embodiments, certain elements may be removed from or additional elements may be added to the OLED display 100 illustrated in FIG. 1. Furthermore, two or more elements may be combined into a single element, or a single element may be realized as multiple elements.

Referring to FIG. 1, the OLED display 100 includes a gate driver 10, a light emission control driver 20, a data driver 30, and a pixel unit 40. The pixel unit 40 includes a plurality of pixels 50.

The gate driver 10 generates a gate signal in response to driving power and control signals supplied from outside the OLED display 100 and sequentially supplies the gate signal to gate lines S1 to Sn. Then, the pixels 50 are selected by the gate signal to sequentially receive a data signal.

The light emission control driver 20 sequentially supplies a light emission control signal to light emission control lines E1 to En, which are disposed in substantially parallel to the gate lines S1 to Sn, in response to driving power and control signals supplied from the outside. Then, a light emission of the pixels 50 is controlled by the light emission control signal.

The gate driver 10 and the light emission control driver 20 may be provided on a substrate together with a pixel circuit included in the pixel unit 40 in a form of a thin film transistor, or mounted on the substrate in a form of a chip. Positions of the gate driver 10 and the light emission control driver 20 are not limited to those of an illustrated example, but the light emission control driver 20 may be omitted in accordance with a structure of the pixels.

The data driver 30 generates a data signal in response to data and control signals supplied from the outside and supplies the data signal to data lines D1 to Dm. The data signal supplied to the data lines D1 to Dm is supplied to the pixels 50 selected by the gate signal whenever the gate signal is supplied. Then, the pixels 50 charge a voltage corresponding to the data signal.

The pixel unit 40 includes a plurality of pixels 50 positioned at intersections of the gate lines S1 to Sn and the data lines D1 to Dm. The pixel unit 40 is supplied with first power ELVDD, which is high potential pixel power, and second power ELVSS, which is low potential pixel power, from the outside, and the first power ELVDD and the second power ELVSS are transferred to each of the pixels 50.

Then, the pixels 50 emit light with luminance corresponding to a driving current, which flows from the first power ELVDD to the second power ELVSS, in response to the data signal, so as to display an image.

Figure 2:
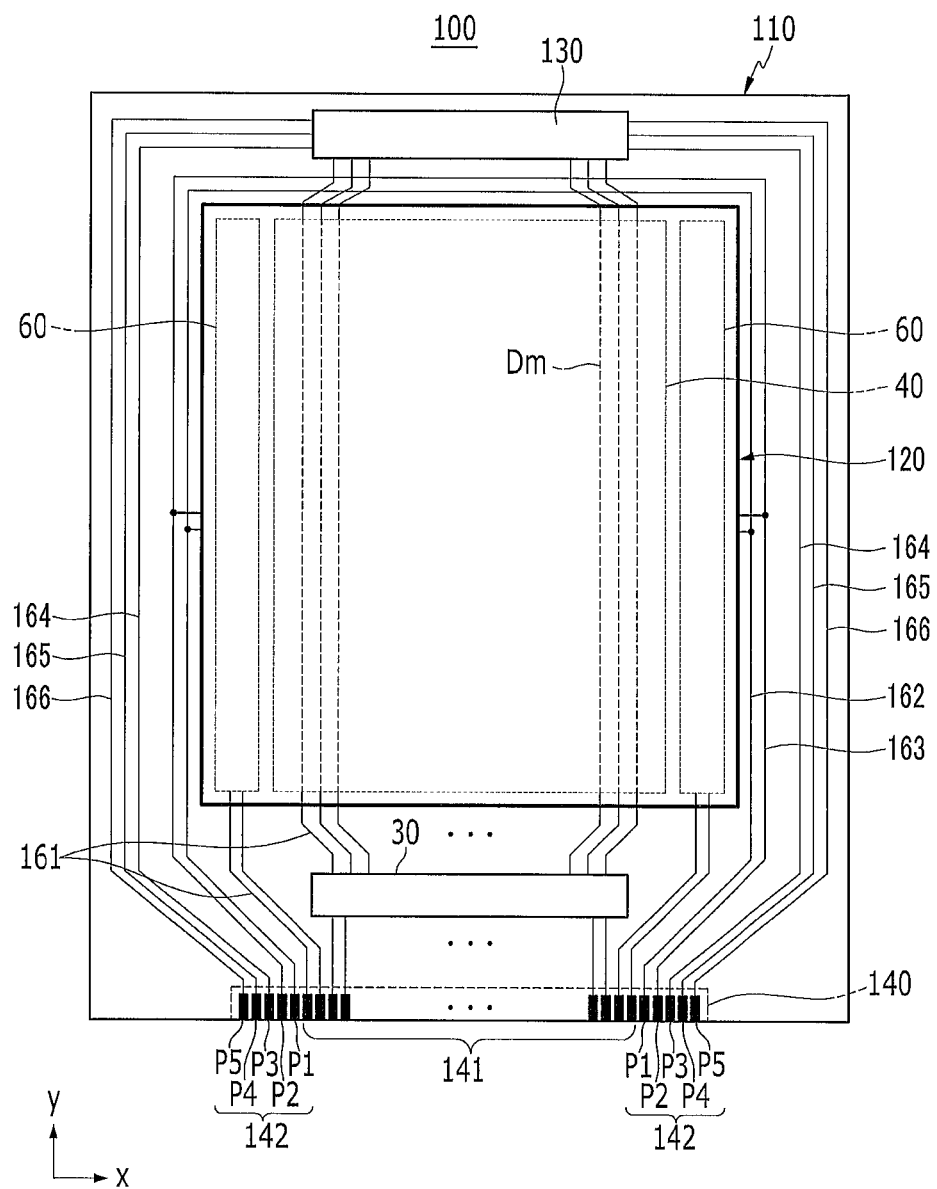
FIG. 2 is a top plan view of the OLED display according to the exemplary embodiment.
Figure 3:
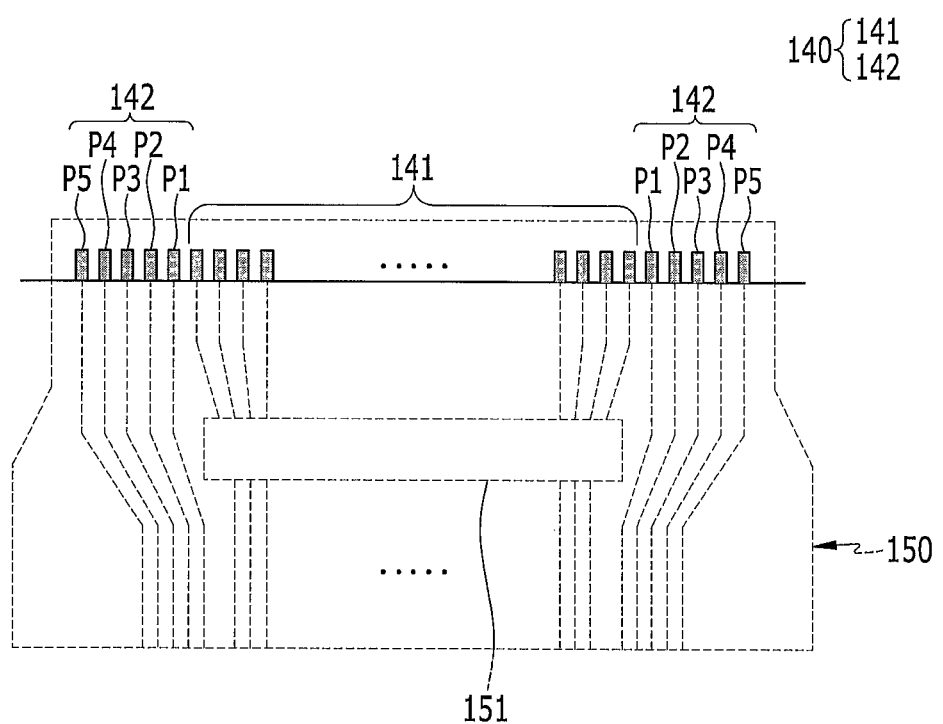
FIG. 3 is a partially enlarged top plan view of the OLED display according to the exemplary embodiment.

FIG. 2 is a top plan view of the OLED display 100 according to the exemplary embodiment, and FIG. 3 is a partially enlarged top plan view of the OLED display 100 according to the exemplary embodiment.

Referring to FIGS. 2 and 3, the OLED display 100 includes a substrate 110, a display unit 120 formed on the substrate 110, a lighting test circuit 130 formed outside the display unit 120 on the substrate 110, and a pad unit 140 formed at an edge of the substrate 110. The pad unit 140 is electrically connected to the display unit 120 and the lighting test circuit 130.

The display unit 120 may include a pixel unit 40 and a driving circuit unit 60 disposed outside the pixel unit 40. The driving circuit unit 60 may include the gate driver and the light emission control driver which are described above. A position and the number of the driving circuit unit 60 are not limited to those of an illustrated example, but the light emission control driver may be omitted.

The data driver 30 may be positioned between the display unit 120 and the pad unit 140. The data driver 30 may be mounted on the substrate 110 in a form of a chip on glass or chip on plastic, or included in a driving IC 151 of a chip on film 150 attached onto the pad unit 140. In the latter case, the data driver 30 is not formed on the substrate 110.

The lighting test circuit 130 may be positioned at one side of the substrate 110 opposite to the pad unit 140, but is not limited to the illustrated example. The lighting test circuit 130 is connected to the data lines Dm of the pixel unit 40 to supply a lighting test signal to the data lines Dm during a lighting test process.

Before attaching the chip on film 150 onto the pad unit 140, the lighting test circuit 130 is used to test lighting of the pixel unit 40, thereby detecting a defective display panel. The lighting test circuit 130 may maintain a turn-off state by a bias signal supplied from the pad unit 140 during a driving period for displaying after a lighting test is completed.

The pad unit 140 includes a plurality of pads arranged along an edge of the substrate 110. The pads are boned to an output pad of the chip on film 150 and receive a signal for displaying from the chip on film 150. The pads are electrically connected to the display unit 120 and the lighting test circuit 130 through respective wirings of the pads.

The pad unit 140 includes a plurality of first pads 141 receiving a signal through the driving IC 151 of the chip on film 150, and a plurality of second pads 142 positioned outside the first pads 141 and receiving a DC signal without using the driving IC 151. The first pad 141 may be referred to as a signal applying pad, and the second pad 142 may be referred to as a bypass pad.

Each of the first pads 141 may be connected to the driving circuit unit 60 and the data driver 30 through a first wiring 161. When the data driver 30 is omitted, each of the first pads 141 is connected to the driving circuit unit 60 and the data lines Dm of the pixel unit 40 through the first wiring 161.

The second pads 142 may include a first power pad P1 for supplying the first power ELVDD to the display unit 120, a second power pad P2 for supplying the second power ELVSS to the display unit 120, and lighting test pads P3, P4, and P5 for supplying a lighting control signal to the lighting test circuit 130. The first power pad P1 is connected to the display unit 120 through a first power wiring 162, and the second power pad P2 is connected to the display unit 120 through a second power wiring 163.

The pixel unit 40 may include a first pixel, a second pixel, and a third pixel having different light emission colors. The light emission color of the first pixel may be red, the light emission color of the second pixel may be green, and the light emission color of the third pixel may be blue.

The lighting test pads P3, P4, and P5 are connected to the lighting test circuit 130 through lighting test wirings 164, 165, and 166. The lighting test pads P3, P4, and P5 may include a pad P3 for a first pixel for supplying a lighting control signal DC_R of the first pixel, a pad P4 for a second pixel for supplying a lighting control signal DC_G of the second pixel, and a pad P5 for a third pixel for supplying a lighting control signal DC_B of the third pixel.

The lighting test wirings 164, 165, and 166 may include a wiring 164 for a first pixel, a wiring 165 for a second pixel, and a wiring 166 for a third pixel which connect the pad P3 for a first pixel, the pad P4 for a second pixel, and the pad P5 for a third pixel to the lighting test circuit 130, respectively. When the pixel unit 40 further includes a fourth white pixel, the lighting test pad and the lighting test wiring may further include a pad for a fourth pixel and a wiring for a fourth pixel, respectively.

When the lighting control signal DC_R of the first pixel is supplied to the lighting test circuit 130, a data signal is supplied to the data lines Dm of the first pixel, so that the first pixel emits light. When the lighting control signal DC_G or DC_B of the second pixel or the third pixel is supplied to the lighting test circuit 130, the data signal is supplied to the data lines Dm of the second pixel or the third pixel, so that the second pixel or the third pixel emits light.

The first and second power pads P1 and P2 are positioned closer to the first pad 141 than the lighting test pads P3, P4, and P5. That is, the first and second power pads P1 and P2 are positioned between the first pad 141 and the lighting test pads P3, P4, and P5, and the lighting test pads P3, P4, and P5 are positioned at the outermost side of the entire pad unit 140. Therefore, the lighting test wirings 164, 165, and 166 may be positioned outside the first and second power wirings 162 and 163 without overlapping the first and second power wirings 162 and 163.

The first and second power wirings 162 and 163 may be formed to surround the display unit 120 outside the display unit 120, and the lighting test wirings 164, 165, and 166 are positioned outside the first and second power wirings 162 and 163.

Figure 4:
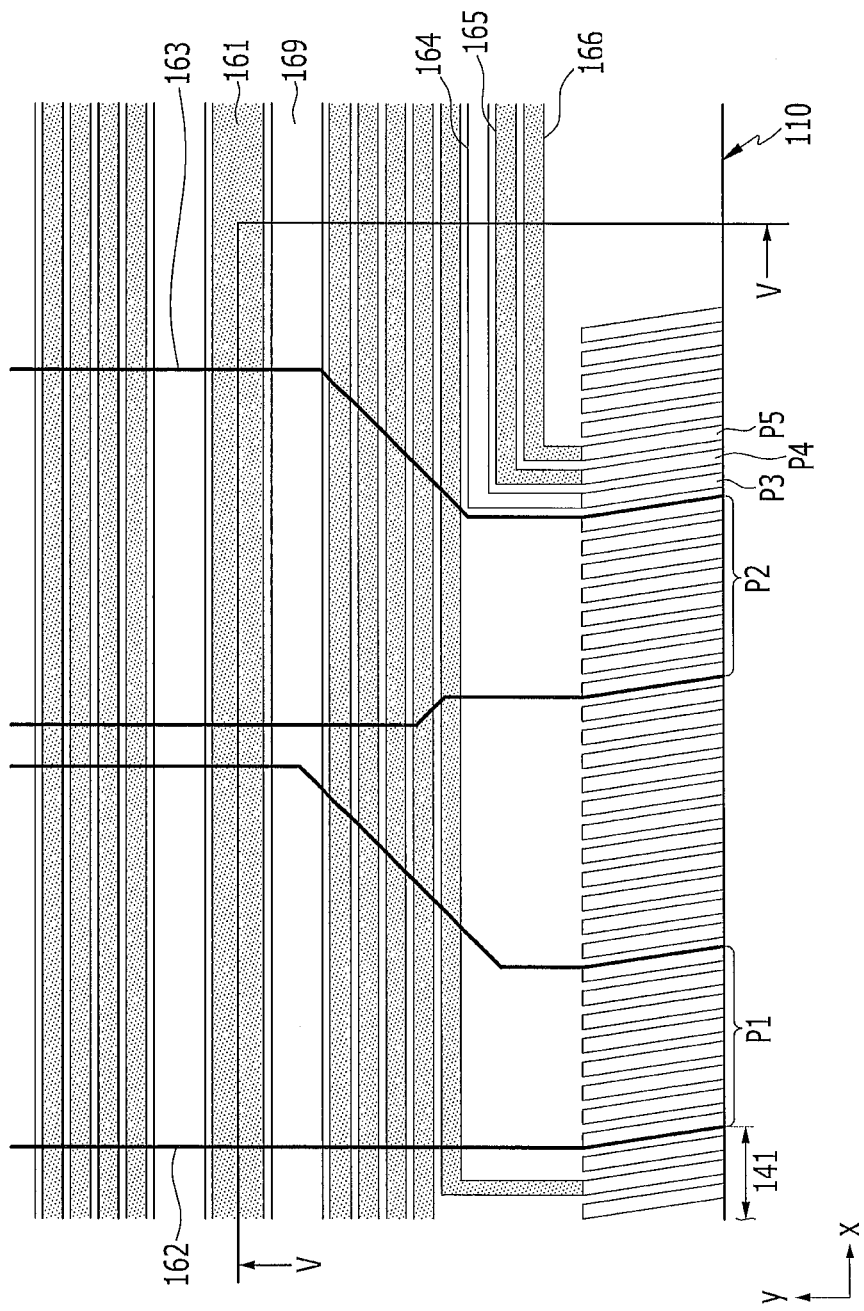
FIG. 4 is a partially enlarged view of the OLED display illustrated in FIG. 2.
Figure 5:
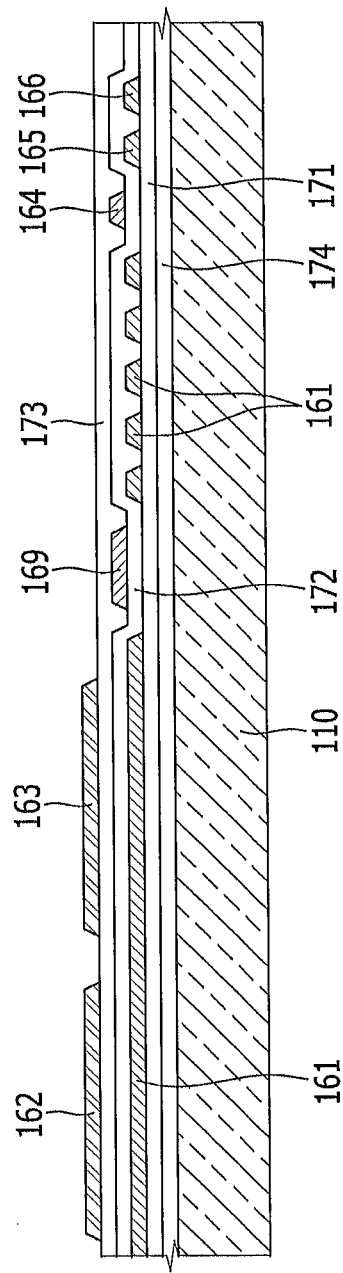
FIG. 5 is a cross-sectional view taken along line V-V of FIG. 4.

FIG. 4 is a partially enlarged view of the OLED display 100 illustrated in FIG. 2, and FIG. 5 is a cross-sectional view taken along line V-V of FIG. 4.

Referring to FIGS. 4 and 5, the first power pad P1 and the second power pad P2 are positioned outside the plurality of first pads 141, and the lighting test pads P3, P4, and P5 are positioned outside the second power pad P2. The first power wiring 162 extends in a y-axis direction based on the drawings and is connected to the first power pad P1. The second power wiring 163 extends in the y-axis direction at a predetermined distance from the first power wiring 162 and is connected to the second power pad P2.

The lighting test wirings 164, 165, and 166 are connected to the lighting test pads P3, P4, and P5, and extend from the lighting test pads P3, P4, and P5 in a direction (x-axis direction) crossing the first and second power wirings 162 and 163. In this case, an extension direction of the lighting test wirings 164, 165, and 166 is a direction in which the lighting test wirings 164, 165, and 166 become far from the first and second power wirings 162 and 163. Therefore, the lighting test wirings 164, 165, and 166 do not overlap the first and second power wirings 162 and 163.

Meanwhile, some of the first wirings 161 may overlap the first and second power wirings 162 and 163, as necessary. In FIG. 3, wirings extending in the x-axis direction other than the three lighting test wirings 164, 165, and 166 are some of the first wirings 161, and a dummy wiring 169 may be positioned between the first wirings 161 extending in the x-axis direction.

Some of the illustrated three lighting test wirings 164, 165, and 166 may be formed of a first gate metal layer, and the others may be formed of a second gate metal layer. Further, the first and second power wirings 162 and 163 may be formed of a source-drain metal layer. FIG. 5 illustrates an example in which the wiring 165 for a second pixel and the wiring 166 for a third pixel are formed of a first gate metal layer, and the wiring 164 for a first pixel is formed of a second gate metal layer.

The first gate metal layer is formed on a first gate insulating layer 171. The second gate metal layer is formed on a second gate insulating layer 172, and is covered with an interlayer insulating layer 173. The first power wiring 162 and the second power wiring 163 are formed on the interlayer insulating layer 173, and formed of a source-drain metal layer.

Some of the first wirings 161, which cross the first and second power wirings 162 and 163 and extend in the x-axis direction, may be formed of a first gate metal layer, and the dummy wiring 169 may be formed of a second gate metal layer. In FIG. 4, reference numeral 174 represents a buffer layer.

In this way, the first and second power wirings 162 and 163 for transferring the DC signal and the lighting test wirings 164, 165, and 166 do not overlap each other, so that it is possible to prevent a burning phenomenon due to a voltage difference between the first and second power wirings 162 and 163 and the lighting test wirings 164, 165, and 166 from occurring in an aging process after manufacturing a display panel.

The pixel 50 of the pixel unit 40 includes an OLED, and a pixel circuit controlling a light emission of the OLED. The OLED includes a pixel electrode, an emission layer, and a common electrode, and the pixel circuit includes at least two thin film transistors and at least one capacitor.

When foreign materials are included in the emission layer during a process of forming the emission layer by depositing an organic layer, a short circuit between the pixel electrode and the common electrode is caused, which may result in a dark defect. Further, when the OLED is turned on immediately after forming the emission layer, luminance may be decreased relatively sharply due to an initial degradation phenomenon.

Aging may refer to a process of accelerating a reduction in initial luminance by applying a predetermined voltage to the OLED. By the aging process, a driving characteristic of the display unit 120 may be stabilized, and as a result, a lifespan of the display unit 120 may be improved.

During the aging process, a DC voltage is applied to each of the first and second power wirings 162 and 163 and the lighting test wirings 164, 165, and 166. In this case, the polarity of the DC voltage of the first and second power wirings 162 and 163 is opposite to that of DC voltage of the lighting test wirings 164, 165, and 166, which makes a large voltage difference between the first and second power wirings 162 and 163 and the lighting test wirings 164, 165, and 166 during the aging process.

When it is assumed that the lighting test wirings and the first and second power wirings are sequentially positioned outside the first pads (when the first and second power wirings are positioned at the outermost side of the pad unit), the lighting test wirings overlap the first and second power wirings. In this case, during the aging process, heat is generated due to the large voltage difference between the first and second power wirings and the lighting test wirings, which may lead to a burning phenomenon.

However, in the present exemplary embodiment, since the lighting test wirings 164, 165, and 166 do not overlap the first and second power wirings 162 and 163, even though the large voltage difference occurs between the first and second power wirings 162 and 163 and the lighting test wirings 164, 165, and 166 during the aging process, heat is not generated. Accordingly, the OLED display 100 according to the present exemplary embodiment may prevent damage to the display panel due to burning.

While the inventive technology has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
a display unit formed over a substrate;
a lighting test circuit and a data driver formed outside the display unit on the substrate;
a pad unit including a plurality of first pads configured to supply a control signal to the display unit, and a plurality of second pads positioned outside the first pads and configured to transfer a DC signal; and
a power wiring electrically connecting the power pad and the display unit,
wherein the second pads include a power pad configured to supply power to the display unit, and a lighting test pad positioned outside the power pad, and wherein a first wiring connecting the data driver and the first pads overlaps the power wiring on a plan view.

2. The OLED display of claim 1, further comprising:
a lighting test wiring not overlapping the power wiring and electrically connecting the lighting test pad and the lighting test circuit.

3. The OLED display of claim 2, wherein the power wiring includes a first portion extending in one direction and connected to the power pad, and wherein the lighting test wiring includes a second portion extending from the lighting test pad in a direction where the lighting test wiring becomes farther from the power wiring.

4. The OLED display of claim 2, wherein the lighting test circuit is formed at one side of the substrate opposite to the pad unit, and connected to data lines of the display unit.

5. The OLED display of claim 4, wherein the power wiring surrounds the display unit, and wherein the lighting test wiring is formed outside the power wiring.

6. The OLED display of claim 2, wherein the power pad and the power wiring include a first power pad and a first power wiring configured to supply first power, a second power pad and a second power wiring configured to supply second power, respectively.

7. The OLED display of claim 6, wherein each of the first power wiring and the second power wiring is formed of a source-drain metal layer.

8. The OLED display of claim 2, wherein the display unit includes a first pixel, a second pixel, and a third pixel configured to emit light of different colors, and wherein the lighting test pad and the lighting test wiring include three lighting test pads and three lighting test wirings for the first pixel, the second pixel, and the third pixel, respectively.

9. The OLED display of claim 8, wherein at least one of the three lighting test wirings is formed of a first gate metal layer, and wherein the others are formed of a second gate metal layer.

10. The OLED display of claim 1, further comprising:
a power wiring configured to connect the power pad and the display unit; and
a lighting test wiring configured to connect the lighting test pad and the lighting test circuit,
wherein the lighting test wiring is positioned farther from the display unit than the power wiring.

11. The OLED display of claim 10, wherein the power wiring and the lighting test wiring are positioned outside the display unit.

12. The OLED display of claim 11, wherein the power wiring and the lighting test wiring are directly connected to the pad unit.

13. The OLED display of claim 11, wherein the power wiring and the lighting test wiring do not overlap each other on a plain view of the OLED display.

14. The OLED display of claim 11, wherein the power wiring and the lighting test wiring are connected to different ones of the second pads.

15. An organic light emitting diode (OLED) display comprising:
a display unit configured to display an image;
a lighting test circuit and a data driver positioned outside the display unit;
a pad unit including a plurality of first pads configured to supply a control signal to the display unit, a power pad positioned outside the first pads and configured to supply power to the display unit, and a lighting test pad positioned outside the power pad;
a power wiring electrically connecting the power pad and the display unit; and
a lighting test wiring electrically connecting the lighting test pad and the lighting test circuit,
wherein the power wiring and the lighting test wiring do not overlap each other on a plain view of the OLED display, and wherein a first wiring connecting the data driver and the first pads overlaps the power wiring on a plan view.

16. The OLED display of claim 15, wherein the power wiring and the lighting test wiring are positioned outside the display unit.

17. The OLED display of claim 16, wherein the power wiring and the lighting test wiring are directly connected to the pad unit.

18. The OLED display of claim 15, wherein the power wiring includes a first portion extending in one direction and connected to the power pad, and wherein the lighting test wiring includes a second portion extending from the lighting test pad in a direction where the lighting test wiring becomes farther from the power wiring.

19. The OLED display of claim 15, wherein the lighting test circuit is positioned at one side of the substrate opposite to the pad unit, and connected to data lines of the display unit.

* * * * *